United States Patent
Hsieh et al.

(10) Patent No.: US 10,340,300 B2
(45) Date of Patent: Jul. 2, 2019

(54) IMAGE SENSOR WITH TRENCHED FILLER GRID

(71) Applicant: Taiwan Semiconductor Manufacturing Company Limited, Hsin-Chu (TW)

(72) Inventors: Feng-Chien Hsieh, Pingtung (TW); Chi-Cherng Jeng, Tainan City, CA (US); Chen Hsin-Chi, Tainan (TW); Shih-Ciang Huang, Tainan (TW); Wang Chun-Ying, Tainan (TW); Volume Chien, Tainan (TW); Zhe-Ju Liu, Pingzhen (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 15/345,311

(22) Filed: Nov. 7, 2016

(65) Prior Publication Data
US 2017/0053959 A1    Feb. 23, 2017

Related U.S. Application Data

(62) Division of application No. 13/838,156, filed on Mar. 15, 2013, now Pat. No. 9,490,288.

(51) Int. Cl.
*H01L 27/146* (2006.01)

(52) U.S. Cl.
CPC .. *H01L 27/14629* (2013.01); *H01L 27/14621* (2013.01); *H01L 27/14627* (2013.01); *H01L 27/14645* (2013.01); *H01L 27/14685* (2013.01)

(58) Field of Classification Search
None
See application file for complete search history.

(56) References Cited

U.S. PATENT DOCUMENTS

| 2006/0076636 A1* | 4/2006 | Fukunaga | H01L 27/14625 257/432 |
| 2006/0113622 A1* | 6/2006 | Adkisson | H01L 21/76819 257/443 |

(Continued)

FOREIGN PATENT DOCUMENTS

CN    101494199 A    7/2009

OTHER PUBLICATIONS

Corresponding Chinese Application 201310351553.7, Chinese Office action dated Dec. 28, 2016, 6 pages.

(Continued)

*Primary Examiner* — Jay C Chang
(74) *Attorney, Agent, or Firm* — Cooper Legal Group, LLC

(57) ABSTRACT

Among other things, one or more image sensors and techniques for forming such image sensors are provided. An image sensor comprises a photodiode array configured to detect light. A filler grid is formed over the photodiode array, such as over a dielectric grid. The filler grid comprises one or more filler structures, such as a first filler structure that provides a light propagation path to a first photodiode that is primarily through the first filler structure. In this way, signal strength decay of light along the light propagation path before detection by the first photodiode is mitigated. The image sensor comprises a reflective layer that channels light towards corresponding photodiodes. For example, a first reflective layer portion guides light towards the first photodiode and away from a second photodiode. In this way, crosstalk, otherwise resulting from detection of light by incorrect photodiodes, is mitigated.

19 Claims, 14 Drawing Sheets

(56) References Cited

U.S. PATENT DOCUMENTS

| | | | |
|---|---|---|---|
| 2006/0163451 A1* | 7/2006 | Park | H01L 27/14621 250/208.1 |
| 2007/0187787 A1* | 8/2007 | Ackerson | H01L 27/14625 257/428 |
| 2007/0200054 A1* | 8/2007 | Reznik | H01L 27/14625 250/208.1 |
| 2009/0095968 A1 | 4/2009 | Baek et al. | |
| 2011/0001206 A1* | 1/2011 | Li | H01L 27/14625 257/432 |
| 2012/0267745 A1* | 10/2012 | Tsuji | H01L 27/14621 257/432 |
| 2012/0273906 A1* | 11/2012 | Mackey | H01L 27/14605 257/432 |

OTHER PUBLICATIONS

Corresponding Chinese Application 201310351553.7, Chinese Office action dated Apr. 28, 2016, 8 pages.

* cited by examiner

IMAGE SENSOR WITH TRENCHED FILLER GRID

RELATED APPLICATION(S)

This application is a divisional of U.S. patent application Ser. No. 13/838,156, titled "IMAGE SENSOR WITH TRENCHED FILLER GRID WITHIN A DIELECTRIC GRID INCLUDING A REFLECTIVE PORTION, A BUFFER, AND A HIGH-K DIELECTRIC" (As Amended) and filed on Mar. 15, 2013, which is incorporated herein by reference.

BACKGROUND

An image sensor is used to convert an optical image focused on the image sensor into an electrical signal. The image sensor comprises an array of light detecting elements, such as photodiodes, where a light detecting element is configured to produce an electrical signal corresponding to an intensity of light impinging on the light detecting element. The electrical signal is used to display a corresponding image on a monitor or provide information about the optical image. In some embodiments, the image sensor is a charge-coupled device (CCD), a Complementary Metal-Oxide-Semiconductor (CMOS) image sensor device, or other type of sensor.

DETAILED DESCRIPTION

Figure 1:
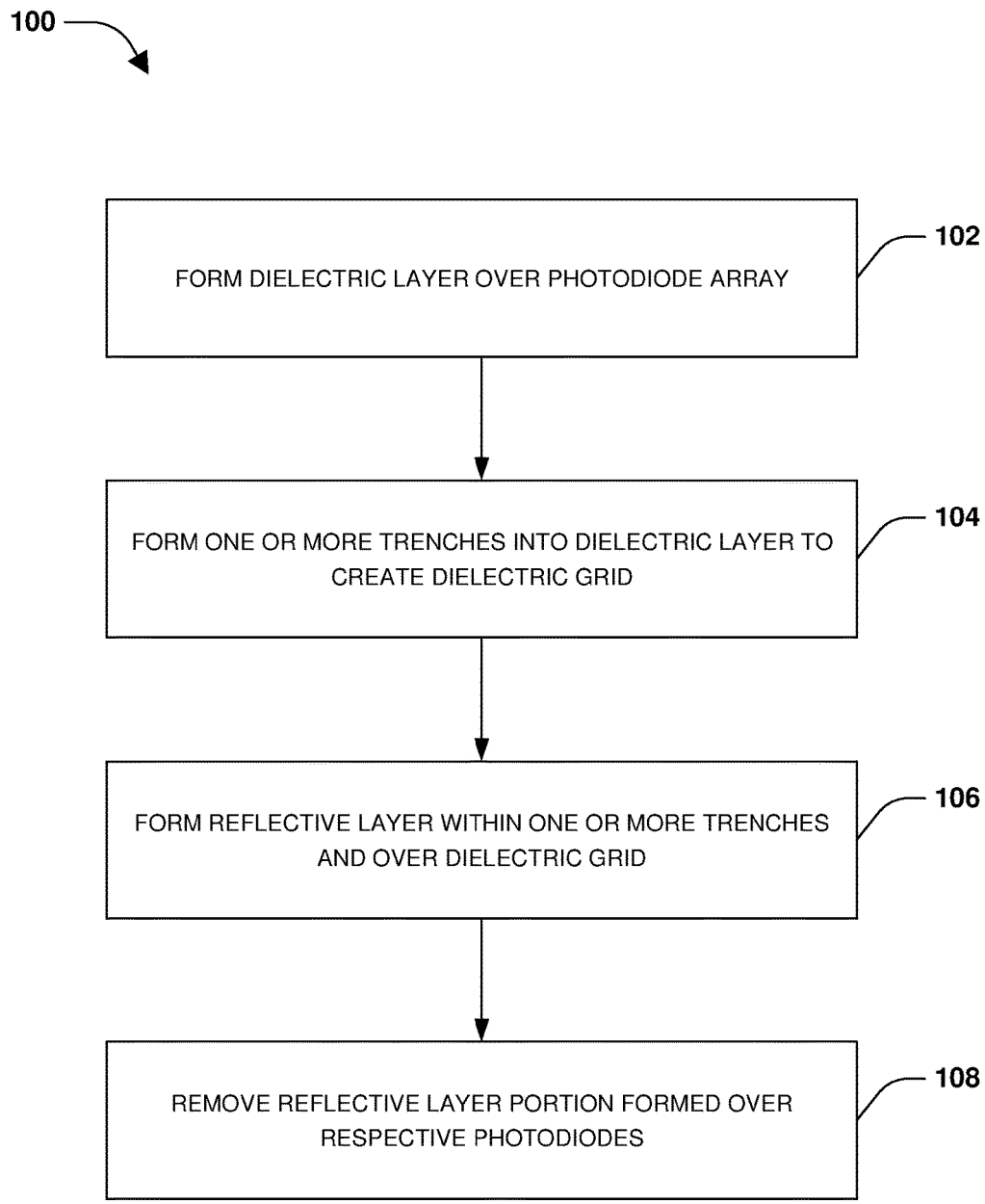
FIG. 1 is a flow diagram illustrating a method of forming an image sensor, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter can be practiced without these specific details. In other instances, structures and devices are illustrated in block diagram form in order to facilitate describing the claimed subject matter.

One or more image sensors and one or more techniques for forming such image sensors are provided herein. In an example, an image sensor comprises a photodiode array formed over a substrate. The photodiode array comprises one or more photodiodes, such as image sensor pixels, configured to accumulate energy generated by light, such as from photons, of an optical image. A voltage of a photodiode can be read as an output for the optical image. In some embodiments, a photodiode is situated under one or more layers or components formed over the substrate. Because light travels along a light path that comprises such layers or components before reaching the photodiode, signal strength of the light can decay before reaching the photodiode or the light can travel towards another photodiode that is not to detect the light. For example, the light could be detected by a neighboring or adjacent photodiode, which can result in crosstalk because incorrect or multiple photodiodes are detecting light that is otherwise to be detected by a particular photodiode. Crosstalk can degrade performance of the image sensor, increase noise, and decrease signals produced by the image sensor.

Accordingly, one or more image sensors comprising a filler grid that is formed over a dielectric grid and one or more image sensors comprising a reflective layer that guides light to particular photodiodes are provided herein. In some embodiments, an image sensor comprises a dielectric layer formed over a photodiode array. One or more trenches are formed into the dielectric layer to form a dielectric grid. The one or more trenches are filled with filler material to form a filler grid. The filler grid comprises one or more filler structures, such as a first filler structure formed over a first photodiode. The first filler structure is formed substantially between a top surface of the dielectric grid and a top surface of the first photodiode, such that a light propagation path to the first photodiode does not comprise the dielectric grid. In this way, the light propagation path primarily comprises the first filler structure, which results in a relatively shorter light propagation path in order to mitigate light signal decay. In some embodiments, a reflective layer is formed between the filler grid and the dielectric grid, such that the reflective layer guides light towards particular photodiodes of the photodiode array, which mitigates crosstalk where an incorrect photodiode detects light.

Figure 2:
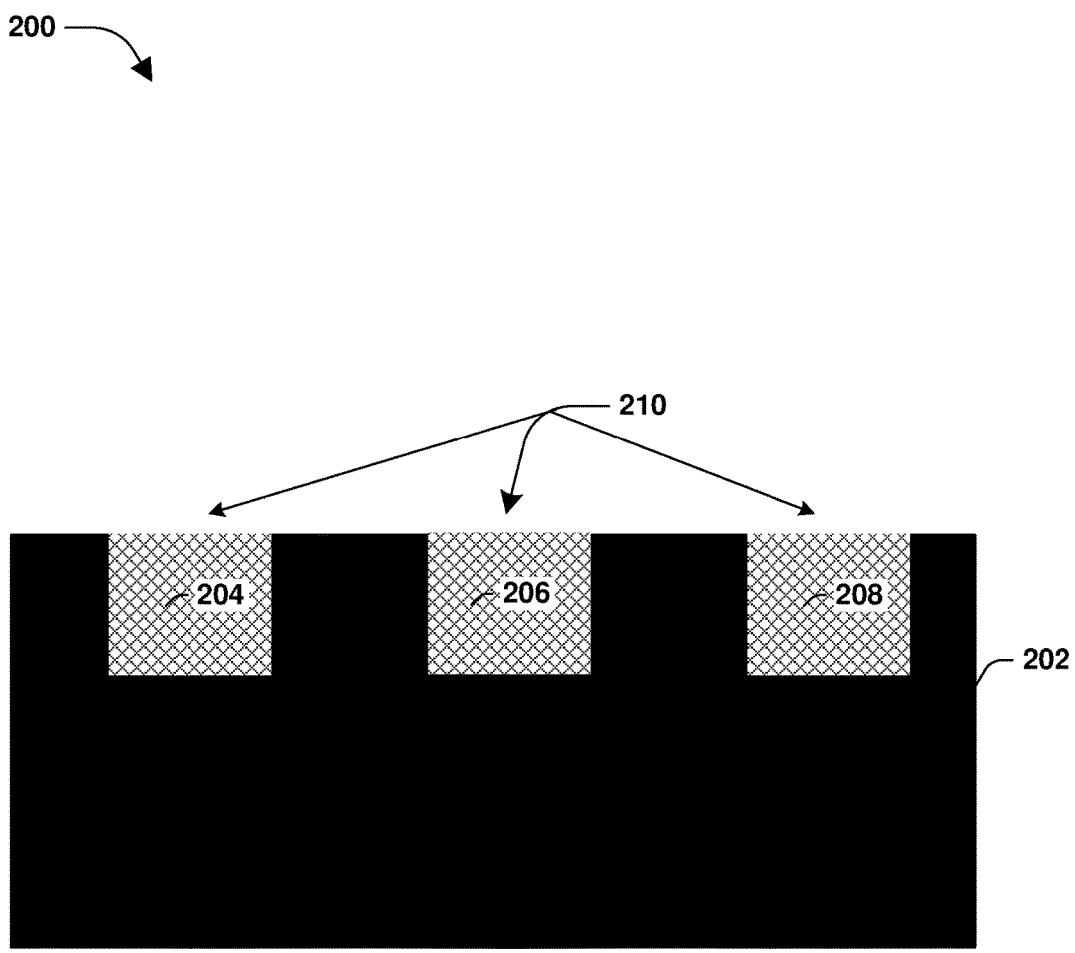
FIG. 2 is an illustration of a photodiode array of an image sensor, according to some embodiments.
Figure 3:
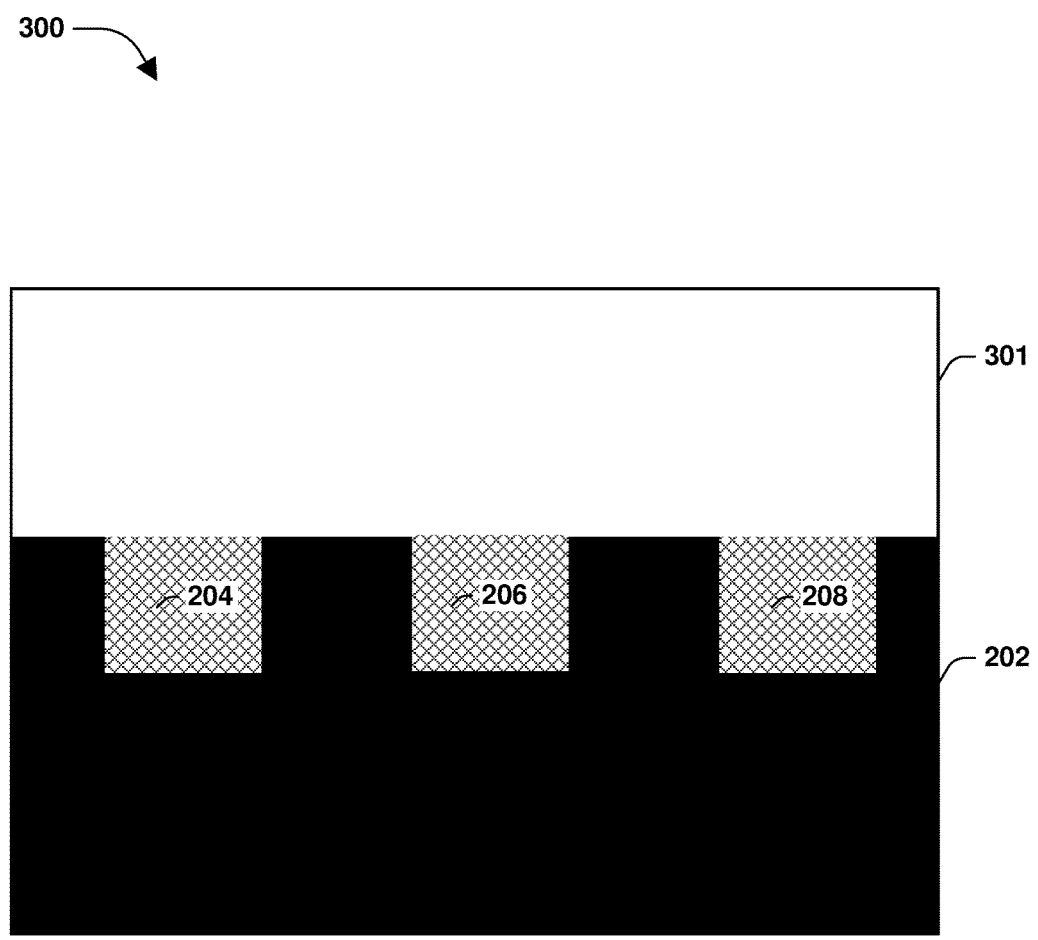
FIG. 3 is an illustration of a dielectric layer of an image sensor, according to some embodiments.

A method 100 of forming an image sensor, according to some embodiments, is illustrated in FIG. 1, and one or more image sensors formed by such a methodology are illustrated in FIG. 2. A photodiode array 210 is formed over a substrate 202, such as a silicon substrate, as illustrated in example 200 of FIG. 2. The photodiode array 210 comprises one or more photodiodes, such as a first photodiode 204, a second photodiode 206, and a third photodiode 208. At 102, a dielectric layer 301 is formed over the photodiode array 210, as illustrated in example 300 of FIG. 3. The dielectric layer 301 is formed to protect the photodiode array 210, components, or layers formed beneath the dielectric layer 301. The dielectric layer 301 allows light to pass through, but a signal strength of the light can decay due to the light passing through the dielectric layer 301 before reaching the photodiode array 210. In some embodiments, the dielectric layer 301 comprises a dielectric material, such as oxide, silicon oxide (SiO), silicon nitride (SiN), silicon oxy-nitride (SiON), or other dielectric material. In some embodiments, the dielectric layer 302 is formed using chemical vapor deposition (CVD) or other techniques, such as a sputtering process. In an example, the dielectric layer 301 is formed at a thickness of about 10,000 A or less.

Figure 4:
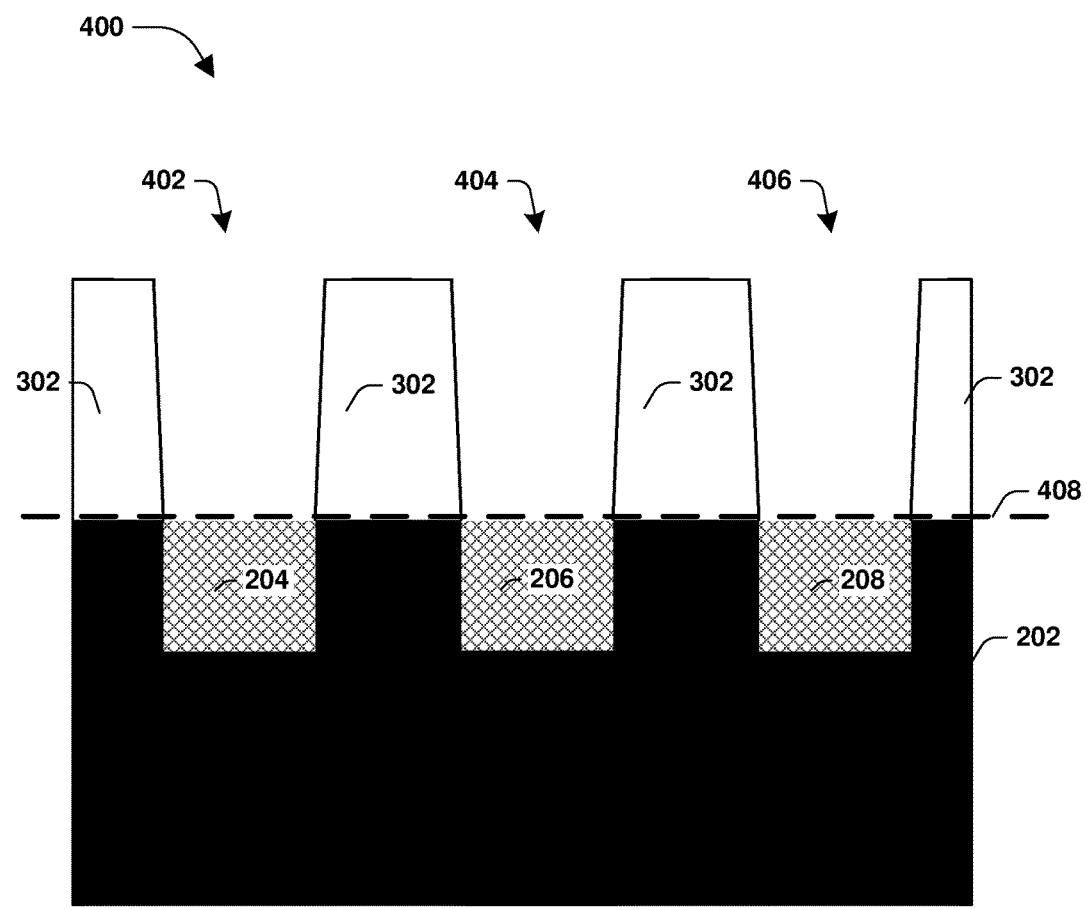
FIG. 4 is an illustration of one or more trenches formed into a dielectric layer to form a dielectric grid of an image sensor, according to some embodiments.

At 104, one or more trenches are formed into the dielectric layer 301 to create a dielectric grid 302, as illustrated by example 400 of FIG. 4. In some embodiments, a first trench 402 is formed within the dielectric layer 301 substantially over the first photodiode 204, a second trench 404 is formed within the dielectric layer 301 substantially over the second photodiode 206, and a third trench 406 is formed within the dielectric layer 301 substantially over the third photodiode 208. In some embodiments, the one or more trenches are formed to a depth corresponding to a top portion of the photodiode array 210, as illustrated by dashed line 408. In an example, the one or more trenches are formed using an etching process, a photolithography process, or other process that can remove portions of the dielectric layer 301. In some embodiments, the one or more trenches are formed with slanted edges, as illustrated by example 400 of FIG. 4. In some embodiments, the one or more trenches are formed with substantially vertical edges based upon pressure or gas concentrations used during etching.

Figure 5A:
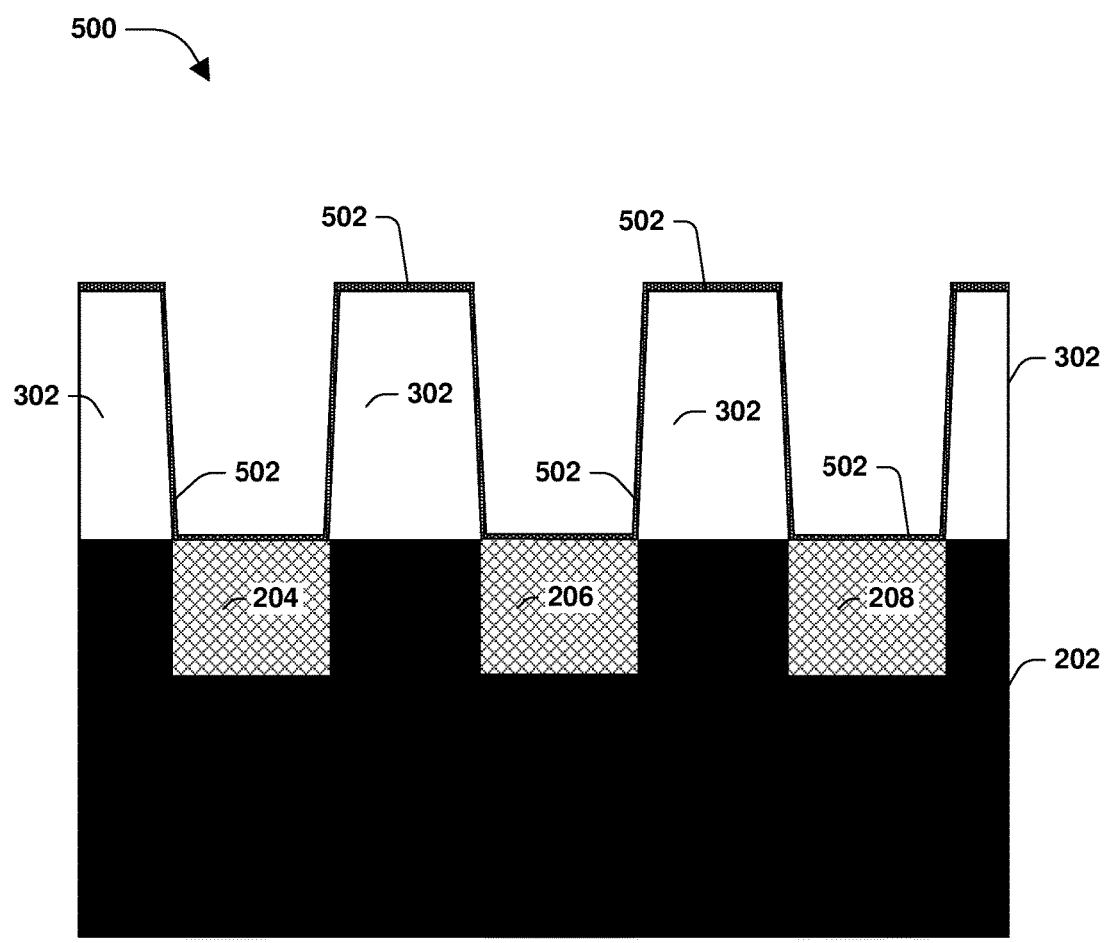
FIG. 5A is an illustration of a high-k dielectric layer of an image sensor, according to some embodiments.

In some embodiments, a high-k dielectric layer 502 is formed over the dielectric grid 302 and the photodiode array 210, as illustrated by example 500 of FIG. 5A. The high-k dielectric layer 502 mitigates noise when the image sensor is switched on or off. That is, one or more dangling bonds can form between the photodiode array 210 and a layer formed above the photodiode array 210. For example, the dangling bonds comprise electrons or other particles that result from CVD or other processing. The high-k dielectric layer 502 can mate with the dangling bonds so that electrons or other particles do not create noise. In some embodiments, the high-k dielectric layer 502 is formed by a sputter process, a physical vapor deposition (PVD), CVD, or other process. In some embodiments, the high-k dielectric layer 502 comprises a dielectric material having k value of about 20 or more. In some embodiments, the high-k dielectric layer 502 is formed to a thickness of about 100 nm.

Figure 5B:
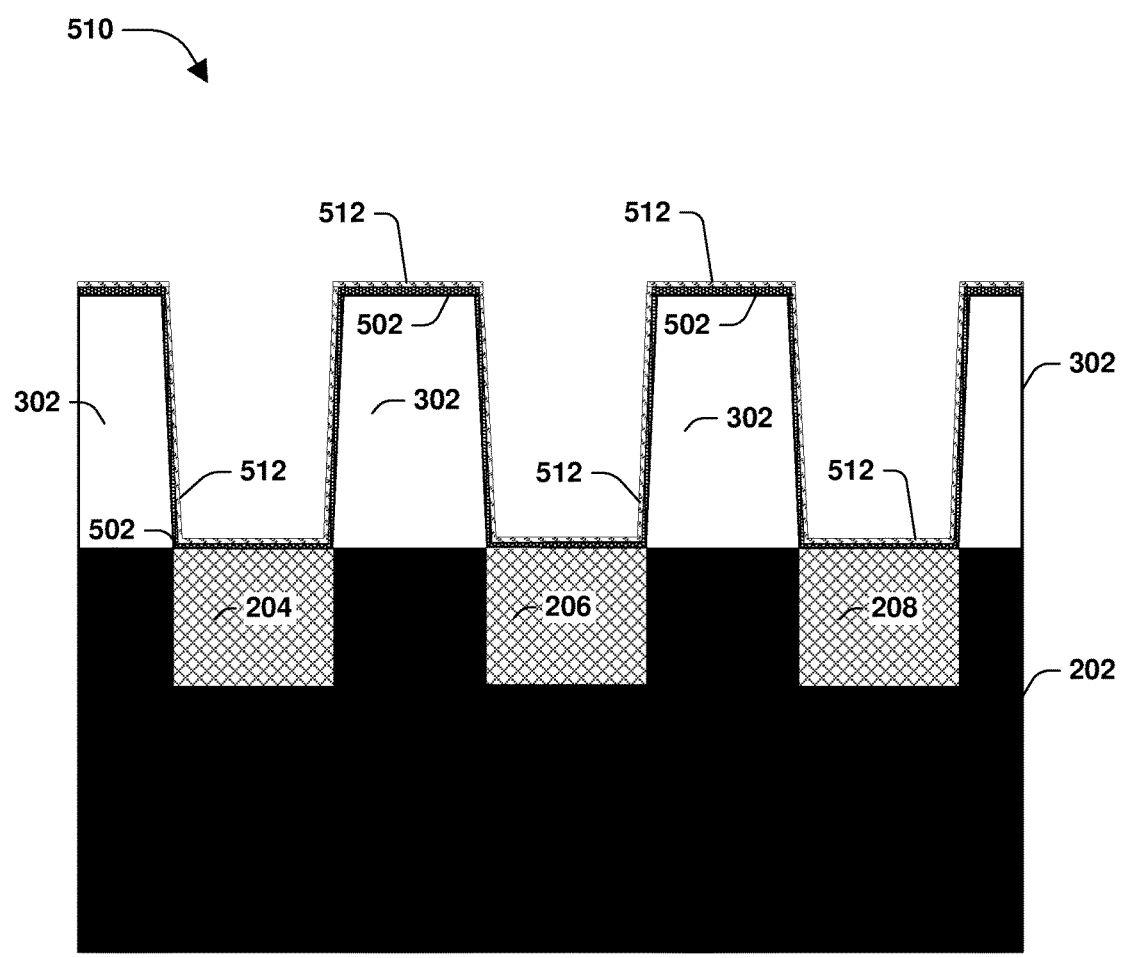
FIG. 5B is an illustration of a buffer layer of an image sensor, according to some embodiments.

In some embodiments, a buffer layer 512 is formed over the dielectric layer 302 and the photodiode array 210, such as over the high-k dielectric layer 502, as illustrated by example 510 of FIG. 5B. The buffer layer 512 protects the high-k dielectric layer 502 during subsequent processing, such as during an etching process used to remove material, such as a reflective layer portion 534 illustrated in FIG. 5D, that could otherwise block a light propagation path to the photodiode array 210. In some embodiments, the buffer layer 512 is formed using CVD or other process. In some embodiments, the buffer layer 512 is formed to a thickness of about 100 nm. In some embodiments, the buffer layer 512 comprises an oxide material.

Figure 5C:
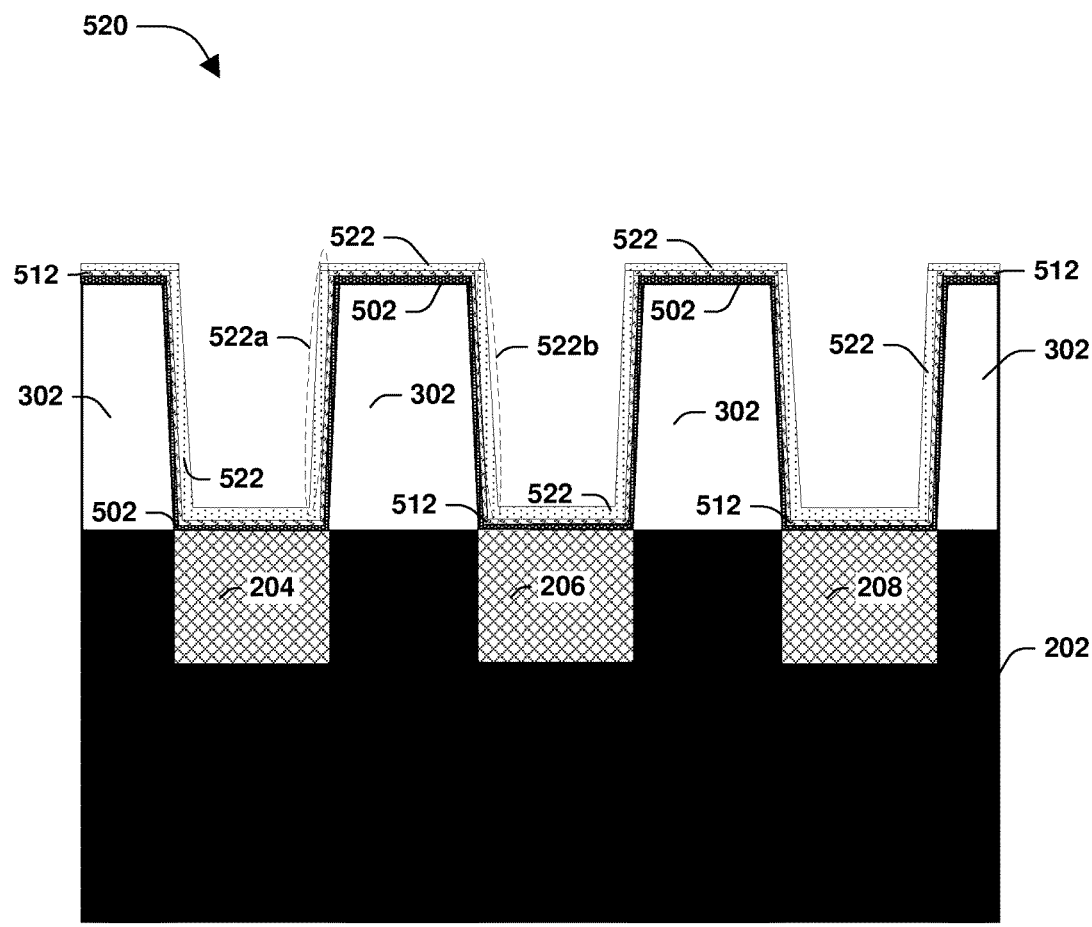
FIG. 5C is an illustration of a reflective layer of an image sensor, according to some embodiments.

At 106, a reflective layer 522 is formed within the one or more trenches, such as the first trench 402, the second trench 404, and the third trench 406 illustrated in FIG. 4, and the reflective layer 522 is formed over the dielectric grid 302. For example, the reflective layer 522 is formed over the buffer layer 512, as illustrated by example 520 of FIG. 5C. The reflective layer 522 comprises a material having a relatively high reflectivity that is capable of guiding, such as reflecting, light substantially towards corresponding photodiodes of the photodiode array 210. For example, the reflective layer 522 comprises a metal, such as aluminum. In some embodiments, the reflective layer 522 is formed by a sputtering process, CVD, a platting process, or other process. In some embodiments, the reflective layer 522 has a relatively uniform thickness, such as a thickness of about 2,000 A. In an example, the reflective layer 522 has a first reflective portion 522a configured to guide light towards the first photodiode 204, and reflect the light away from the second photodiode 206. In another example, the reflective layer 522 has a second reflective portion 522b configured to guide light towards the third photodiode 208, and reflect the light away from the second photodiode 206. In this way, the reflective layer 522 has one or more reflective portions configured to guide, such as reflect or channel, light to corresponding photodiodes.

Figure 5D:
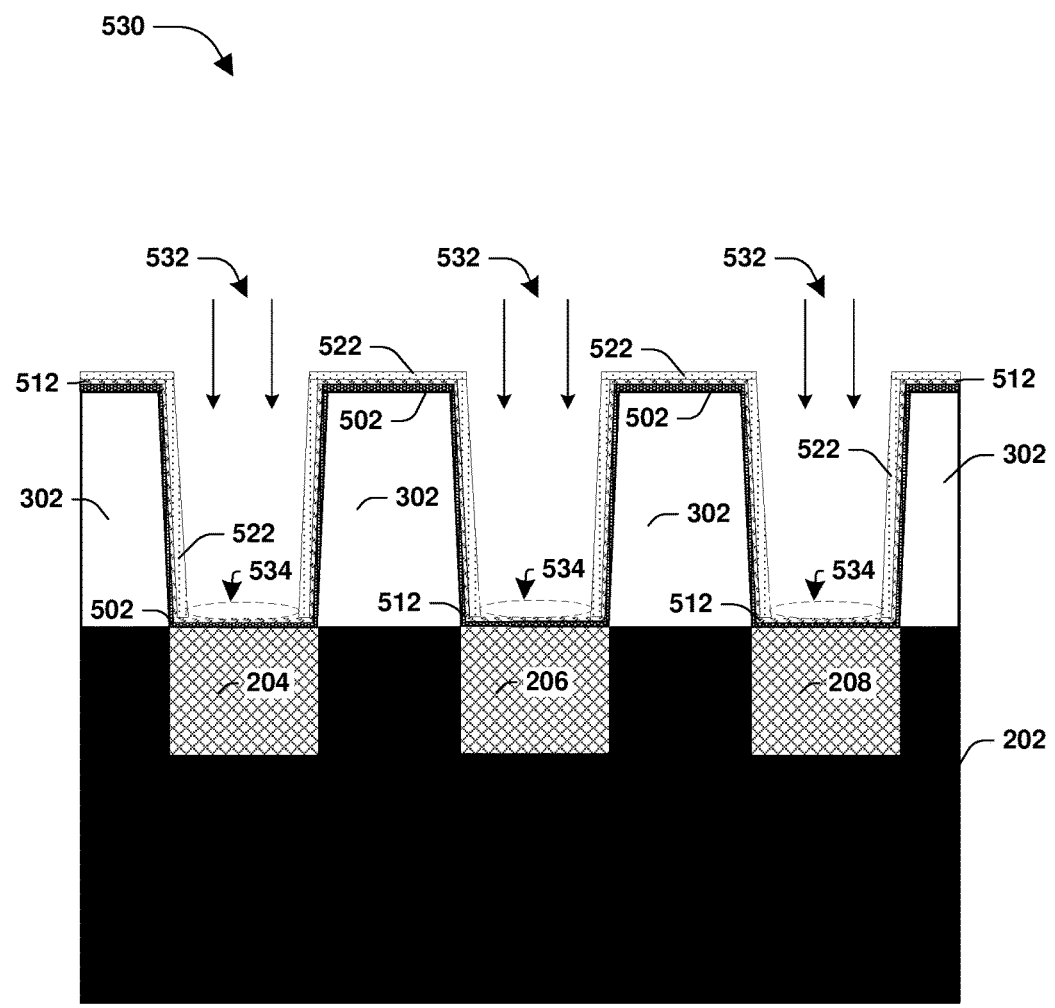
FIG. 5D is an illustration of removing a reflective layer portion of a reflective layer of an image sensor, according to some embodiments.

At 108, a reflective layer portion 534 that is formed over respective photodiodes of the photodiode array 210 is removed, as illustrated in example 530 of FIG. 5D. In this way, the reflective layer 522 is not formed over respective photodiodes of the photodiode array 210 so that a light propagation path to the photodiode array 210 is not blocked. In some embodiments, a mask is used to cover portions of the reflective layer 522 that are not to be removed by an etching process 532 used to remove the reflective layer portion 534, such as portions of the reflective layer 522 formed over a top surface and vertical sides of the dielectric grid 302. In some embodiments, a dry etching process is used to remove the reflective layer portion 534.

Figure 5E:
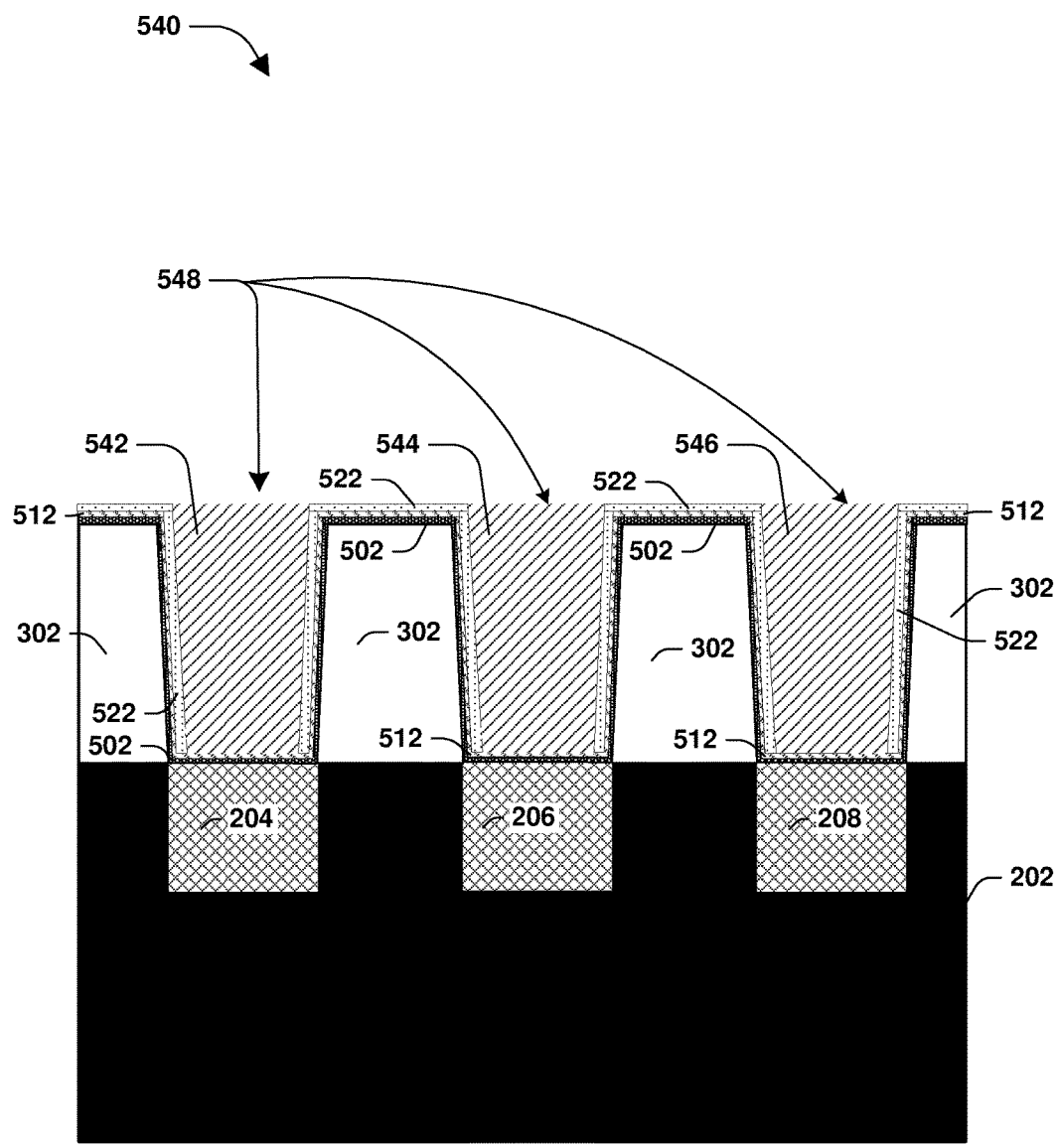
FIG. 5E is an illustration of a filler grid of an image sensor, according to some embodiments.

In some embodiments, a filler grid 548 is formed over the reflective layer 522, as illustrated by example 540 of FIG. 5E. The filler grid 548 is formed over respective photodiodes of the photodiode array 210. For example, a first filler structure 542 is formed substantially over the first photodiode 204, a second filler structure 544 is formed substantially over the second photodiode 206, and a third filler structure 546 is formed substantially over the third photodiode 208. It will be appreciated that the filler grid 548 is formed on the buffer layer 512 in areas where reflective layer portions 534 are removed, as illustrated in FIG. 5D. Similarly, in an embodiment where the buffer layer 512 is not formed, the filler grid 548 is formed on the high-k dielectric layer 502, and in an embodiment where the high-k dielectric layer 502 is not formed, the filler grid 548 is formed on the photodiodes. In some embodiments, the filler grid 548 is formed between a top surface of the buffer layer 512 that covers respective photodiodes of the photodiode array 210 and a top surface of the reflective layer 522 over the dielectric grid 302. In an embodiment, the filler grid 548 is thus slightly taller than the dielectric grid 302, such that a top surface of the filler grid 548 is a farther distance away from a top surface of the substrate than a top surface of the dielectric grid 302 is away from the top surface of the substrate 202. It will be appreciated, however, that the filler grid 548 can be formed to have any desired height or other dimensions. The first filler structure 542 provides a light propagation path to the first photodiode 204. The light propagation path does not comprise the dielectric grid 302 because the dielectric grid 302 is not situated between the first filler structure 542 and the first photodiode 204. In this way, the light propagation path is primarily through the first filler structure 542, which can mitigate decay of a signal strength of light traveling to the first photodiode 204. In some embodiments, the filler grid 548 is formed by a spin coating process or other process. In some embodiments, a filler structure comprises a dielectric material, an organic material, a polymer, a color filter material that allows particular wavelengths of light to pass there-through, or any other fill material.

In some embodiments, at least some different filler structures are configured to allow different colors or wavelengths of light to pass there-through. For example, the first filler structure 542 is configured to allow red light, or wavelengths corresponding to red-light, to pass there-through, but substantially no other colors of light; the second filler structure 544 is configured to allow blue light, or wavelengths corresponding to blue-light, to pass there-through, but substantially no other colors of light; the third filler structure 546 is configured to allow green light, or wavelengths corresponding to green-light, to pass there-through, but substantially no other colors of light, etc. In some embodiments, the first photodiode 204 detects red light, the second photodiode 206 detects blue light, and the third photodiode 208 detects green light. In some embodiments, other photodiodes detect other colors of light. In some embodiments, such as where different filler structures allow different colors to pass there-through, multiple processes are used to form the filler grid 542. For example, a first process is used to form the first filler structure 542, where areas where the second and third filler structures 544, 546 exist or are to be formed are masked off; a second process is used to form the second filler structure 544, where areas where the first and third filler structures 542, 546 exist or are to be formed are masked off; a third process is used to form the third filler structure 546, where areas where the first and second filler structures 542, 544 exist or are to be formed are masked off, etc.

Figure 5F:
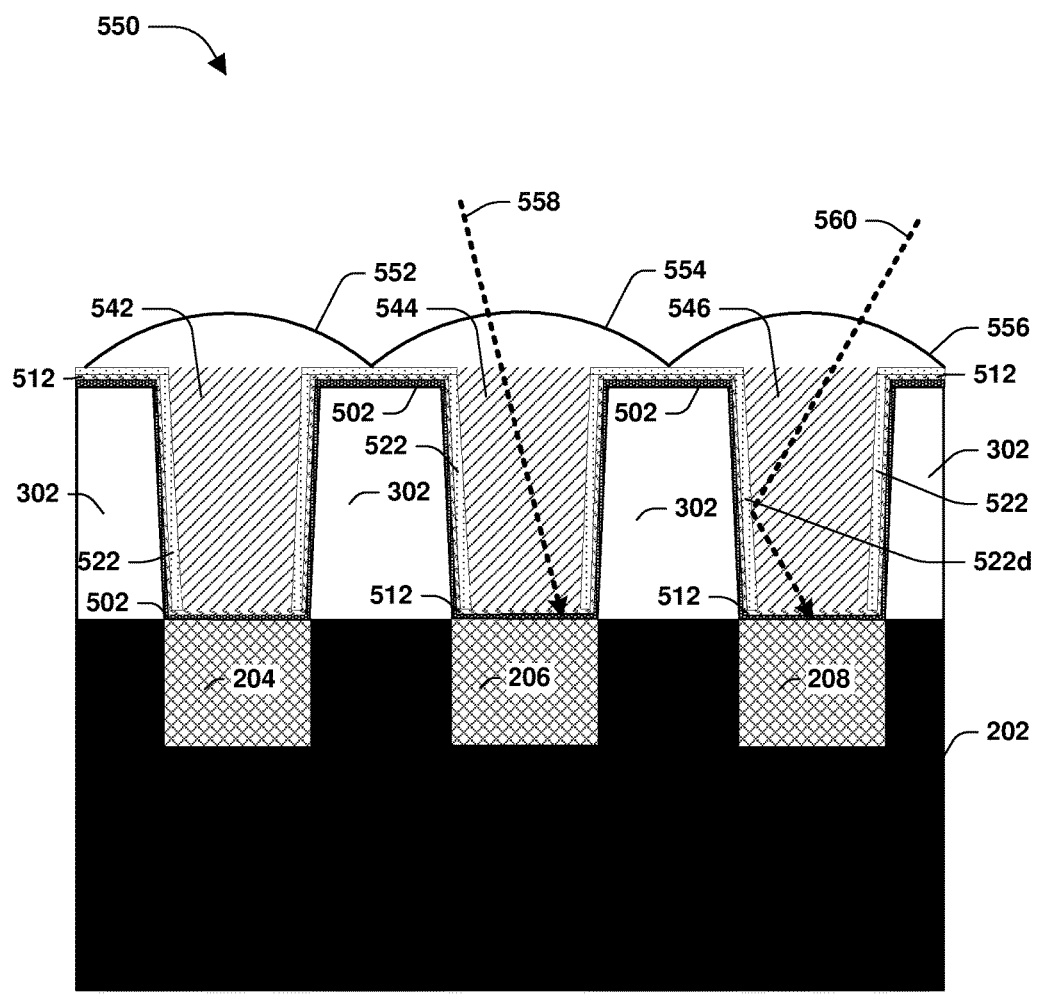
FIG. 5F is an illustration of a photodiode array detecting light, according to some embodiments.

In some embodiments, one or more lens structures, such as micro lenses, are formed over the filler grid 548, as illustrated by example 550 of FIG. 5F. For example, a first lens structure 552 is formed substantially over the first filler structure 542, a second lens structure 554 is formed substantially over the second filler structure 544, and a third lens structure 556 is formed substantially over the third filler structure 546.

In an example of detecting light, light 558 passes through the second lens structure 554, as illustrated by example 550 of FIG. 5F. The light 558 travels through the second filler structure 544 to the second photodiode 206, and is detected by the second photodiode 206. In some embodiments, the light 558 passes through the buffer layer 512 and the high-k dielectric layer 502 before reaching the second photodiode 206. Because the light propagation path of the light 558 primarily corresponds to the second filler structure 544 and not the dielectric grid 302, signal strength decay of the light 558 before detection by the second photodiode 206 is mitigated as compared to a light propagation path that passes through other layers, such as the dielectric grid 302. Thus, the second photodiode 206 can detect a relatively strong signal from the light 558, which improves a signal-to-noise ratio of the image sensor.

In another example of detecting light, light 560 passes through the third lens structure 556, as illustrated by example 550 of FIG. 5F. The light 560 travels through the third filler structure 546 and encounters a surface of a reflective portion 522d formed between the barrier layer 512 and the third filler structure 546. Because the reflective portion 522d has a relatively high reflectance relative to the third filler structure 546, the light 560 is reflected towards the third photodiode 208 and away from the second photodiode 206. Because the reflective portion 522d channels the light 560 towards the third photodiode 208 and away from the second photodiode 206, crosstalk between photodiodes is mitigated because the second photodiode 206 does not incorrectly detect the light 560 that is to be detected by the third photodiode 208, thus improving the signal-to-noise ratio of the image sensor because of a decrease in error or loss of signal. Because the light propagation path of the light 560 primarily corresponds to the third filler structure 546 and not the dielectric grid 302, signal strength decay of the light 560 before detection by the third photodiode 208 is mitigated as compared to a light propagation path that passes through other layers, such as the dielectric grid 302. Thus, the third photodiode 208 can detect a relatively strong signal from the light 560, which can improve a signal-to-noise ratio of the image sensor.

Figure 6A:
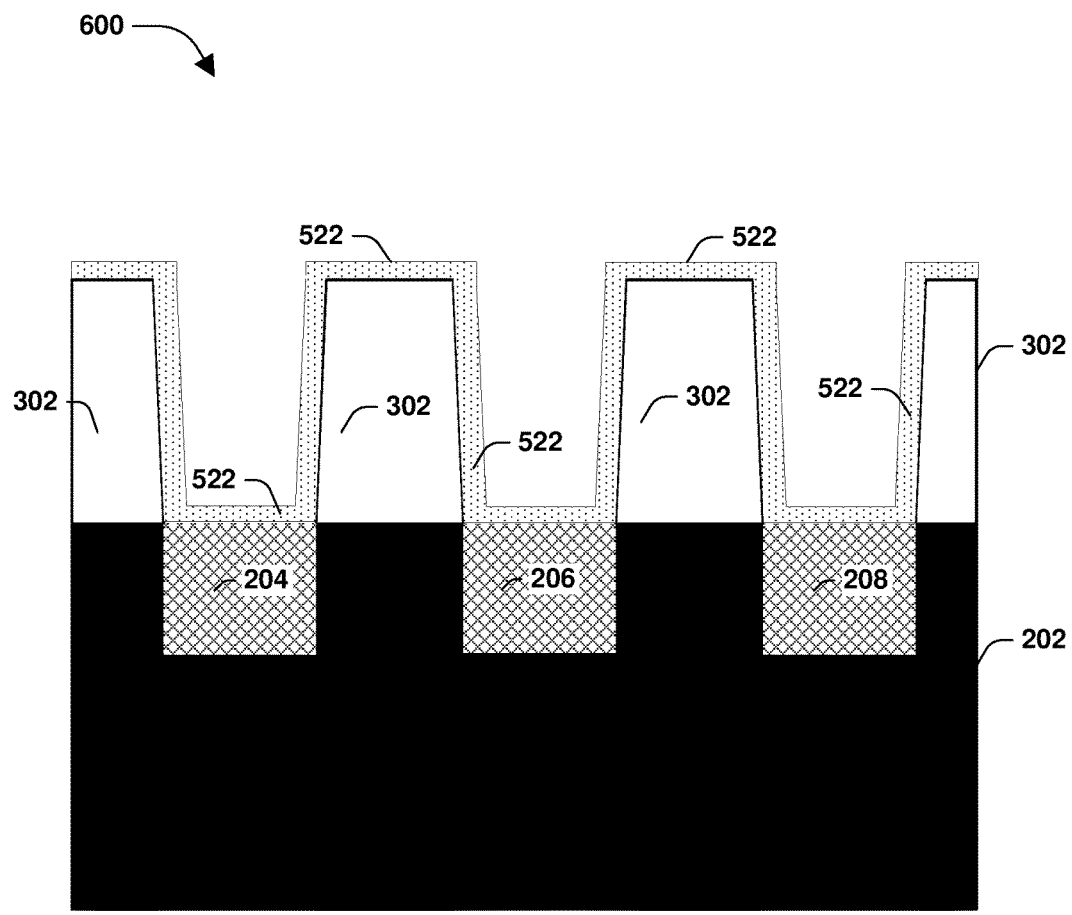
FIG. 6A is an illustration of a reflective layer of an image sensor, according to some embodiments.
Figure 6B:
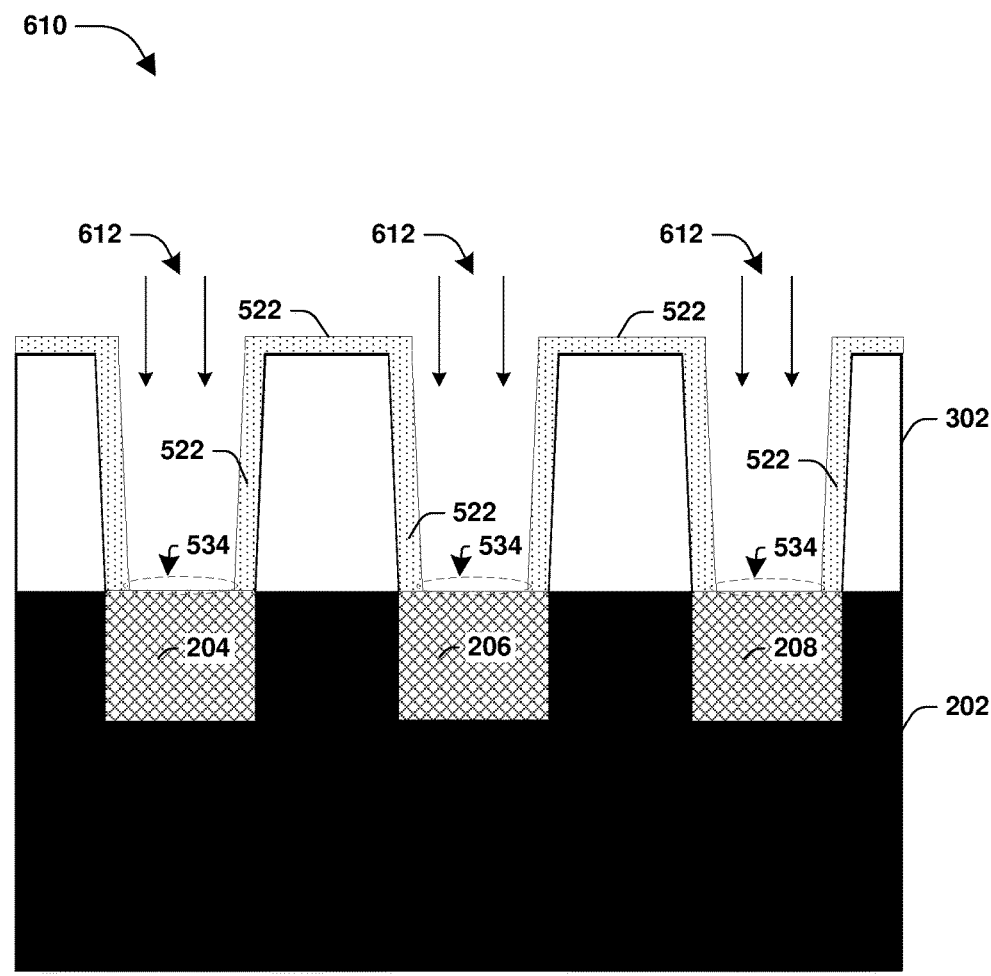
FIG. 6B is an illustration of removing a reflective layer portion of a reflective layer of an image sensor, according to some embodiments.

In some embodiments, the image sensor does not comprise a high-k dielectric layer 502 and/or the buffer layer 512, as illustrated in example 600 of FIG. 6A. That is, the high-k dielectric layer 502 and/or the buffer layer 512 can be optionally formed or not formed, according to some embodiments. In an example, the one or more trenches are formed within the dielectric layer 301 to create a dielectric grid 302, as illustrated in example 400 of FIG. 4. The reflective layer 522 is formed over the dielectric grid 302 and over respective photodiodes of the photodiode array 210, as illustrated in example 600 of FIG. 6A. In some embodiments, a reflective layer portion 534 that is formed over respective photodiodes of the photodiode array 210 is removed, as illustrated in example 610 of FIG. 6B. For example, an etching process 612 is performed to remove the reflective layer portion 534. In this way, the reflective layer 522 is not formed over respective photodiodes of the photodiode array 210 so that light can reach and be detected by such photodiodes.

Figure 6C:
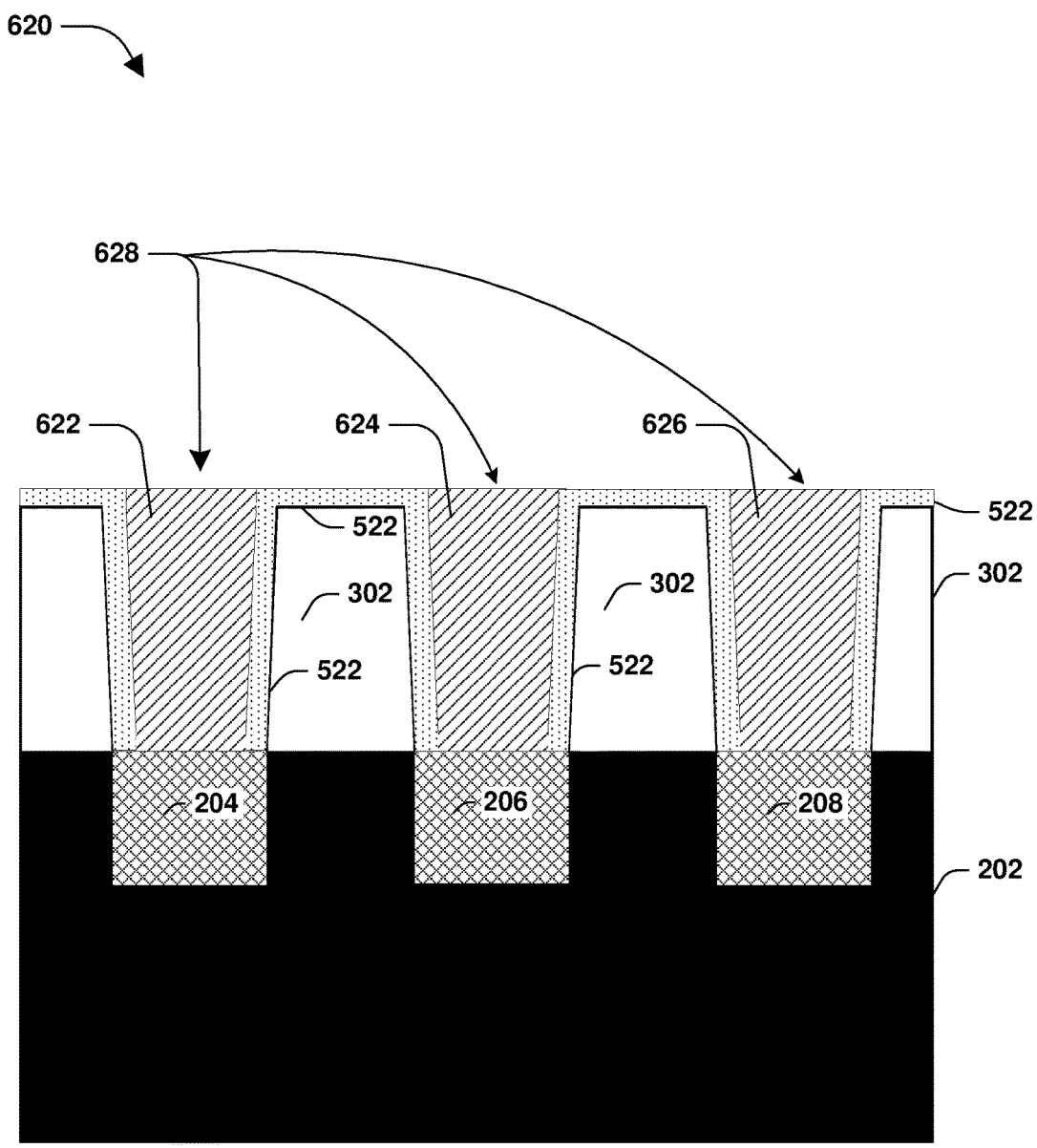
FIG. 6C is an illustration of a filler grid of an image sensor, according to some embodiments.

In some embodiments, a filler grid 628 is formed over respective photodiodes of the photodiode array 210, as illustrated in example 620 of FIG. 6C. For example, a first filler structure 622 is formed substantially over the first photodiode 204, a second filler structure 624 is formed substantially over the second photodiode 206, and a third filler structure 626 is formed substantially over the third photodiode 208. In some embodiments, respective filler structures of the filler grid 628 are formed substantially between top surfaces of respective photodiodes and a top surface of the reflective layer 522 that is portions of the dielectric grid 302. For example, the first filler structure 622 is formed substantially between a top surface of the first photodiode 204 and the top surface of the reflective layer 522 over the dielectric grid 302. The first filler structure 622 provides a light propagation path that primarily corresponds to the first filler structure 622, but not the dielectric grid 302. In some embodiments, one or more lens structures are formed over the filler grid 628, as illustrated in example 630 of FIG. 6D.

Figure 6D:
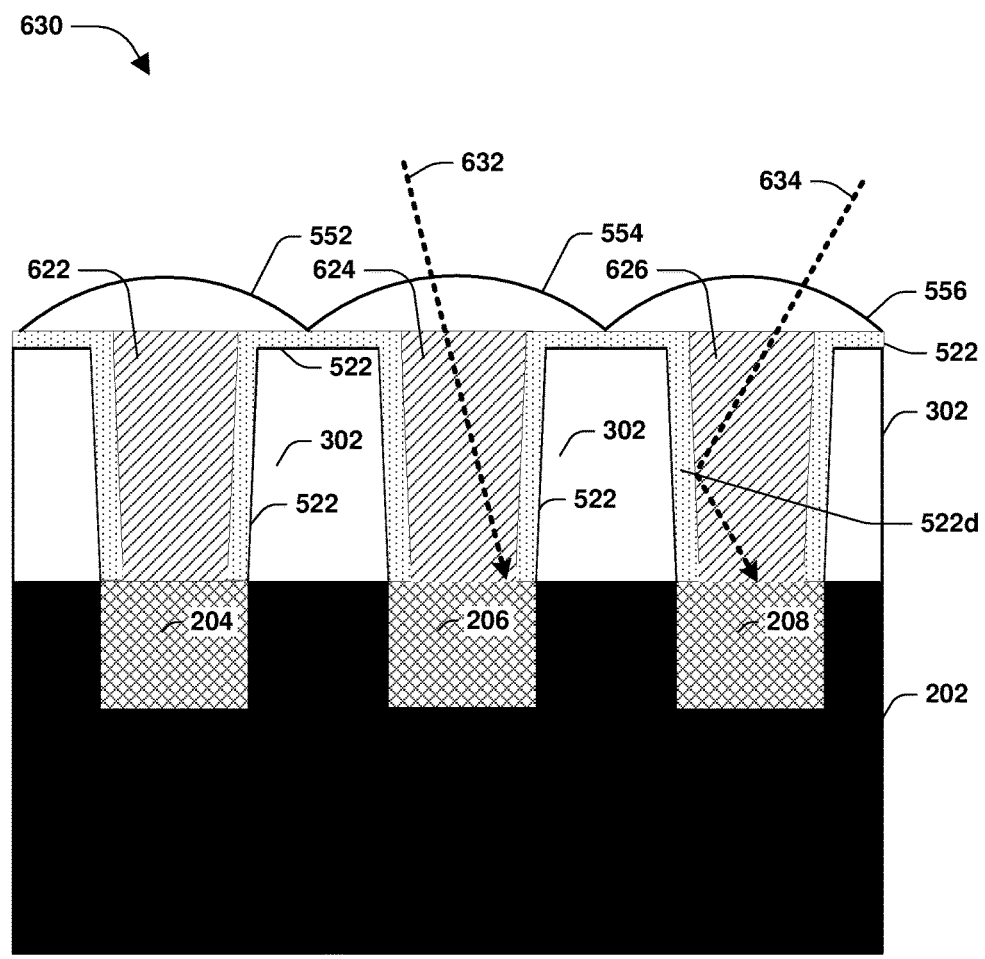
FIG. 6D is an illustration of a photodiode array detecting light, according to some embodiments.

In an example of detecting light, light 632 passes through the second lens structure 554, as illustrated by example 630 of FIG. 6D. The light 632 travels through the second filler structure 624 to the second photodiode 206, and is detected by the second photodiode 206. Because the light propagation path of the light 632 primarily corresponds to the second filler structure 624 and not the dielectric grid 302, signal strength decay of the light 632 before detection by the second photodiode 206 is mitigated as compared to a light propagation path that passes through other layers, such as the dielectric grid 302. Thus, the second photodiode 206 can detect a relatively strong signal from the light 632, which can improve a signal-to-noise ratio of the image sensor.

In another example of detecting light, light 634 passes through the third lens structure 556, as illustrated by example 630 of FIG. 6D. The light 634 travels through the third filler structure 626 and encounters a surface of a reflective portion 522d formed between the dielectric grid 302 and the third filler structure 626. Because the reflective portion 522d has a relatively high reflectance relative to the third filler structure 626, the light 634 is reflected towards the third photodiode 208 and away from the second photodiode 206. Because the reflective portion 522d channels the light 634 towards the third photodiode 208 and away from the second photodiode 206, crosstalk between photodiodes is mitigated because the second photodiode 206 does not incorrectly detect the light 634 that is to be detected by the third photodiode 208, thus improving the signal-to-noise ratio of the image sensor because of a decrease in error or loss of signal. Because the light propagation path of the light 634 primarily corresponds to the third filler structure 626 and not the dielectric grid 302, signal strength decay of the light 634 before detection by the third photodiode 208 is mitigated as compared to a light propagation path that passes through other layers, such as the dielectric grid 302. Thus, the third photodiode 208 can detect a relatively strong signal from the light 634, which can improve a signal-to-noise ratio of the image sensor.

According to an aspect of the instant disclosure, an image sensor is disclosed. The image sensor comprises a photodiode array formed over a substrate. The image sensor comprises a dielectric grid that is formed over the photodiode array. The image sensor comprises a filler grid formed over the dielectric grid. The filler grid comprises one or more filler structures, such as a first filler structure formed over a first photodiode of the photodiode array. The first filler structure is formed substantially between a top surface of the dielectric grid and the first photodiode. The first filler structure provides a light propagation path to the first photodiode that primarily corresponds to the first filler structure as opposed to other layers or structures of the image sensor.

According to an aspect of the instant disclosure, an image sensor is disclosed. The image sensor comprises a photodiode array formed over a substrate. The image sensor comprises a dielectric grid that is formed over the photodiode array. The image sensor comprises a reflective layer formed over the dielectric grid, but not over respective photodiodes of the photodiode array. The reflective layer comprises one or more reflective portions configured to guide light towards corresponding photodiodes. For example, the reflective layer comprises a first reflective portion configured to guide light towards a first photodiode and reflective light away from a second photodiode.

According to an aspect of the instant disclosure, a method for forming an image sensor is provided. The method comprises forming a dielectric grid over a photodiode array comprised within a substrate. One or more trenches are formed into the dielectric layer to form a dielectric grid. The one or more trenches are formed over respective photodiodes of the photodiode array. A reflective layer is formed within the one or more trenches and over the dielectric grid. The reflective layer comprises one or more reflective portions configured to guide light towards corresponding photodiodes. For example, the reflective layer comprises a first reflective portion configured to guide light towards a first photodiode and reflective light away from a second photodiode. A reflective layer portion that is formed over respective photodiodes of the photodiode array is removed. In this way, a filler grid can be formed substantially over respective photodiodes of the photodiode array, such that light can propagate through the filler grid to corresponding photodiodes.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally to be construed to mean "one or more" unless specified otherwise or clear from context to be directed to a singular form. Also, at least one of A and B or the like generally means A or B or both A and B. Furthermore, to the extent that "includes", "having", "has", "with", or variants thereof are used in either the detailed description or the claims, such terms are intended to be inclusive in a manner similar to "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:
1. An image sensor, comprising:
 a first photodiode;
 a dielectric grid comprising a first dielectric structure, wherein:
  the first dielectric structure comprises a bottommost surface in direct physical contact with a substrate and an uppermost surface; and
  the first dielectric structure has a substantially homogeneous material composition which extends between the bottommost surface and the uppermost surface;

a reflective layer having a first portion overlying and in direct physical contact with the uppermost surface;
a first color filter material structure over the first photodiode and having a sidewall in direct physical contact with a sidewall of the reflective layer; and
a lens structure in direct physical contact with the first color filter material structure and the first portion of the reflective layer.

2. The image sensor of claim 1, wherein the first color filter material structure is in direct physical contact with the first photodiode.

3. The image sensor of claim 1, wherein the sidewall of the reflective layer is in direct physical contact with a sidewall of the first dielectric structure.

4. The image sensor of claim 1, wherein:
a first surface of the sidewall of the reflective layer is in direct physical contact with the sidewall of the first color filter material structure, and
a second surface of the sidewall of the reflective layer is in direct physical contact with a sidewall of the first dielectric structure, the second surface of the sidewall of the reflective layer diametrically opposing the first surface of the sidewall of the reflective layer.

5. The image sensor of claim 1, wherein:
the reflective layer extends between the sidewall of the first color filter material structure and a sidewall of a second color filter material structure overlying a second photodiode, and
the second color filter material structure is spaced apart from the first color filter material structure by the first dielectric structure.

6. The image sensor of claim 1, wherein the first color filter material structure has a substantially homogeneous material composition.

7. The image sensor of claim 1, wherein the reflective layer is in direct physical contact with the first photodiode.

8. The image sensor of claim 1, wherein the reflective layer overlies the first photodiode.

9. The image sensor of claim 1, wherein the first photodiode is disposed between the first dielectric structure and a second dielectric structure of the dielectric grid.

10. The image sensor of claim 1, wherein the first dielectric structure comprises at least one of silicon oxide, silicon nitride, or silicon oxy-nitride.

11. The image sensor of claim 1, wherein:
a sidewall of the first dielectric structure is tapered, and
the reflective layer is in direct physical contact with the sidewall of the first dielectric structure.

12. The image sensor of claim 1, wherein the reflective layer is disposed between the lens structure and the first dielectric structure.

13. An image sensor, comprising:
a first photodiode and a second photodiode;
a dielectric grid comprising a first dielectric structure and a second dielectric structure, wherein:
the first dielectric structure comprises a bottommost surface in direct physical contact with a substrate and an uppermost surface; and
the first dielectric structure has a substantially homogeneous material composition which extends between the bottommost surface and the uppermost surface;
a first color filter material structure over the first photodiode and between the first dielectric structure and the second dielectric structure and a second color filter material structure over the second photodiode, wherein the first dielectric structure is disposed between the first color filter material structure and the second color filter material structure;
a lens structure; and
a reflective layer extending between a sidewall of the first color filter material structure and a sidewall of the second color filter material structure and in direct physical contact with the uppermost surface, wherein the reflective layer is in direct physical contact with the lens structure.

14. The image sensor of claim 13, wherein the lens structure is in direct physical contact with the first color filter material structure.

15. The image sensor of claim 13, wherein the reflective layer is in direct physical contact with the first photodiode.

16. The image sensor of claim 13, wherein the reflective layer is in direct physical contact with the uppermost surface.

17. The image sensor of claim 13, wherein the first color filter material structure is in direct physical contact with the first photodiode.

18. The image sensor of claim 13, wherein a sidewall of the reflective layer is in direct physical contact with a sidewall of the first dielectric structure.

19. The image sensor of claim 13, wherein the reflective layer is disposed between the lens structure and the first dielectric structure.

* * * * *